US012802766B2

(12) United States Patent
Liu et al.

(10) Patent No.: US 12,802,766 B2
(45) Date of Patent: Nov. 17, 2026

(54) ELECTRICAL PARAMETER ADJUSTMENT METHOD, MEMORY STORAGE DEVICE, AND MEMORY CONTROL CIRCUIT UNIT

(71) Applicant: PHISON ELECTRONICS CORP., Miaoli (TW)

(72) Inventors: Yu-Heng Liu, Hsinchu County (TW); Yu-Siang Yang, New Taipei City (TW); Chia-Cheng Hsu, New Taipei City (TW); An-Cheng Liu, Taipei City (TW); Wei Lin, Taipei City (TW)

(73) Assignee: PHISON ELECTRONICS CORP., Miaoli (TW)

( * ) Notice: Subject to any disclaimer, the term of this patent is extended or adjusted under 35 U.S.C. 154(b) by 118 days.

(21) Appl. No.: 18/770,583

(22) Filed: Jul. 11, 2024

(65) Prior Publication Data

US 2025/0384942 A1 Dec. 18, 2025

(30) Foreign Application Priority Data

Jun. 17, 2024 (TW) ................................ 113122239

(51) Int. Cl.
*G11C 16/34* (2006.01)
*G11C 16/26* (2006.01)

(52) U.S. Cl.
CPC ............ *G11C 16/349* (2013.01); *G11C 16/26* (2013.01); *G11C 16/3445* (2013.01)

(58) Field of Classification Search
CPC .... G11C 16/349; G11C 16/26; G11C 16/3445
USPC ........................................ 365/185.22, 185.24
See application file for complete search history.

(56) References Cited

U.S. PATENT DOCUMENTS 8,456,911 B2 * 6/2013 Yuan ...................... G11C 16/26 365/185.11
8,499,210 B2 * 7/2013 Kim .................... G11C 11/5628 714/746
9,978,458 B2 * 5/2018 Lee ........................ G11C 16/08
10,269,435 B1 * 4/2019 Chen ...................... G11C 16/10
11,037,635 B1 * 6/2021 Lien ....................... G11C 16/10
11,361,835 B1 * 6/2022 Lien .................. G11C 16/3459
(Continued)

FOREIGN PATENT DOCUMENTS

TW 201923772 6/2019

OTHER PUBLICATIONS

"Office Action of Taiwan Counterpart Application", issued on Jun. 25, 2025, pp. 1-10.

(Continued)

*Primary Examiner* — Michael T Tran
(74) *Attorney, Agent, or Firm* — JCIPRNET

(57) ABSTRACT

An electrical parameter adjustment method, a memory storage device, and a memory control circuit unit are provided. The method includes: detecting a status of a rewritable non-volatile memory module; in response to the status of the rewritable non-volatile memory module meeting a first condition, sending a single-state read command, wherein the single-state read command instructs reading a first physical unit based on a specific voltage, and the specific voltage is a read pass voltage corresponding to the first physical unit; and adjusting at least one electrical parameter of the rewritable non-volatile memory according to a read result of the single-state read command.

24 Claims, 12 Drawing Sheets

(56) References Cited

U.S. PATENT DOCUMENTS

| | | | | |
|---|---|---|---|---|
| 2010/0067305 | A1* | 3/2010 | Park | G11C 16/12 365/189.09 |
| 2012/0236636 | A1* | 9/2012 | Nawata | G11C 11/5628 365/185.18 |
| 2012/0314499 | A1* | 12/2012 | Yuan | G11C 16/349 365/185.11 |
| 2014/0143630 | A1* | 5/2014 | Mu | G11C 29/50004 714/763 |
| 2014/0254262 | A1* | 9/2014 | Chen | G11C 16/3427 365/185.12 |
| 2015/0154069 | A1* | 6/2015 | Tuers | G06F 11/1068 714/773 |
| 2016/0172045 | A1* | 6/2016 | Shukla | G11C 16/0483 365/185.11 |
| 2018/0012667 | A1* | 1/2018 | Costa | G11C 16/0483 |
| 2018/0122484 | A1 | 5/2018 | Jin et al. | |
| 2020/0194094 | A1 | 6/2020 | Yang et al. | |
| 2022/0180940 | A1* | 6/2022 | Sharon | H01L 25/18 |
| 2022/0199175 | A1* | 6/2022 | Lu | G11C 16/32 |
| 2023/0268003 | A1* | 8/2023 | Diep | G11C 16/10 365/185.18 |
| 2023/0307063 | A1 | 9/2023 | Tak | |

OTHER PUBLICATIONS

"Office Action of Taiwan Counterpart Application", issued on Apr. 21, 2025, p. 1-p. 12.

* cited by examiner

ELECTRICAL PARAMETER ADJUSTMENT METHOD, MEMORY STORAGE DEVICE, AND MEMORY CONTROL CIRCUIT UNIT

CROSS-REFERENCE TO RELATED APPLICATION

This application claims the priority benefit of Taiwan application serial no. 113122239, filed on Jun. 17, 2024. The entirety of the above-mentioned patent application is hereby incorporated by reference herein and made a part of this specification.

BACKGROUND

Technical Field

The disclosure relates to an electrical parameter adjustment method, a memory storage device, and a memory control circuit unit.

Description of Related Art

Portable electronic devices such as mobile phones and notebook computers have grown rapidly in the past few years, which has led to a rapid increase in consumer demand for storage media. As the rewritable non-volatile memory module (for example, a flash memory) has characteristics such as non-volatile data, power saving, small volume, and no mechanical structure, the rewritable non-volatile memory module is very suitable for being built into various portable electronic devices exemplified above.

On the other hand, with the development of artificial intelligence technology, the access frequency (especially the data write frequency) of a processing circuit such as a central processing unit (CPU), a graphics processing unit (GPU), a video processing unit (VPU), a neural network processing unit (NPU), and a tensor processing unit (TPU) to the rewritable non-volatile memory module has also greatly increased, thereby causing the wear rate of the rewritable non-volatile memory module to also greatly increase. Therefore, how to respond to the accelerated wear of the rewritable non-volatile memory module caused by the large number of accesses to the rewritable non-volatile memory module during a computing process of an artificial intelligence model is indeed one of the research topics devoted by persons skilled in the art.

SUMMARY

The disclosure provides an electrical parameter adjustment method, a memory storage device, and a memory control circuit unit, which can improve the above issues.

An exemplary embodiment of the disclosure provides an electrical parameter adjustment method for a rewritable non-volatile memory module. The rewritable non-volatile memory module includes multiple physical units. The electrical parameter adjustment method includes the following steps. A status of the rewritable non-volatile memory module is detected. In response to the status of the rewritable non-volatile memory module meeting a first condition, a single-state read command is sent. The single-state read command instructs reading a first physical unit among the physical units based on a specific voltage, and the specific voltage is a read pass voltage corresponding to the first physical unit. At least one electrical parameter of the rewritable non-volatile memory module is adjusted according to a read result of the single-state read command.

An exemplary embodiment of the disclosure also provides a memory storage device, which includes a connection interface unit, a rewritable non-volatile memory module, and a memory control circuit unit. The connection interface unit is configured to couple to a host system. The memory control circuit unit is coupled to the connection interface unit and the rewritable non-volatile memory module. The rewritable non-volatile memory module includes multiple physical units. The memory control circuit unit is configured to execute the following operations. A status of the rewritable non-volatile memory module is detected. In response to the status of the rewritable non-volatile memory module meeting a first condition, a single-state read command is sent. The single-state read command instructs reading a first physical unit among the physical units based on a specific voltage, and the specific voltage is a read pass voltage corresponding to the first physical unit. At least one electrical parameter of the rewritable non-volatile memory module is adjusted according to a read result of the single-state read command.

An exemplary embodiment of the disclosure also provides a memory control circuit unit, which is configured to control a rewritable non-volatile memory module. The rewritable non-volatile memory module includes multiple physical units. The memory control circuit unit includes a host interface, a memory interface, and a memory management circuit. The host interface is configured to couple to a host system. The memory interface is configured to couple to the rewritable non-volatile memory module. The memory management circuit is coupled to the host interface and the memory interface. The memory management circuit is configured to execute the following operations. A status of the rewritable non-volatile memory module is detected. In response to the status of the rewritable non-volatile memory module meeting a first condition, a single-state read command is sent. The single-state read command instructs reading a first physical unit among the physical units based on a specific voltage, and the specific voltage is a read pass voltage corresponding to the first physical unit. At least one electrical parameter of the rewritable non-volatile memory module is adjusted according to a read result of the single-state read command.

An exemplary embodiment of the disclosure also provides an electrical parameter adjustment method for a rewritable non-volatile memory module. The rewritable non-volatile memory module includes multiple physical units. The electrical parameter adjustment method includes the following steps. A status of the rewritable non-volatile memory module is detected. In response to the status of the rewritable non-volatile memory module meeting a first condition, at least one electrical parameter of the rewritable non-volatile memory module is adjusted. The step of adjusting the at least one electrical parameter of the rewritable non-volatile memory module includes at least one of increasing a read pass voltage corresponding to a first physical unit among the physical units and reducing a programming pass voltage corresponding to the first physical unit.

An exemplary embodiment of the disclosure also provides a memory storage device, which includes a connection interface unit, a rewritable non-volatile memory module, and a memory control circuit unit. The connection interface unit is configured to couple to a host system. The memory control circuit unit is coupled to the connection interface unit and the rewritable non-volatile memory module. The rewritable non-volatile memory module includes multiple physical units. The memory control circuit unit is configured to execute the following operations. A status of the rewritable non-volatile memory module is detected. In response to the status of the rewritable non-volatile memory module meeting a first condition, at least one electrical parameter of the rewritable non-volatile memory module is adjusted. The operation of adjusting the at least one electrical parameter of the rewritable non-volatile memory module includes at least one of increasing a read pass voltage corresponding to a first physical unit among the physical units and reducing a programming pass voltage corresponding to the first physical unit.

An exemplary embodiment of the disclosure also provides a memory control circuit unit, which is configured to control a rewritable non-volatile memory module. The rewritable non-volatile memory module includes multiple physical units. The memory control circuit unit includes a host interface, a memory interface, and a memory management circuit. The host interface is configured to couple to a host system. The memory interface is configured to couple to the rewritable non-volatile memory module. The memory management circuit is coupled to the host interface and the memory interface. The memory management circuit is configured to execute the following operations. A status of the rewritable non-volatile memory module is detected. In response to the status of the rewritable non-volatile memory module meeting a first condition, at least one electrical parameter of the rewritable non-volatile memory module is adjusted. The operation of adjusting the at least one electrical parameter of the rewritable non-volatile memory module includes at least one of increasing a read pass voltage corresponding to a first physical unit among the physical units and reducing a programming pass voltage corresponding to the first physical unit.

Based on the above, after detecting the status of the rewritable non-volatile memory module, in response to the status of the rewritable non-volatile memory module meeting the first condition, the single-state read command may be sent to instruct reading the first physical unit in the rewritable non-volatile memory module based on the specific voltage. In particular, the specific voltage is the read pass voltage corresponding to the first physical unit. Thereafter, at least one electrical parameter of the rewritable non-volatile memory module may be dynamically adjusted according to the read result of the single-state read command. Thereby, even if the rewritable non-volatile memory module is in an operating environment where a large number of accesses is executed, the reliability of the rewritable non-volatile memory module can be effectively improved and/or the service life of the rewritable non-volatile memory module can be effectively extended.

DESCRIPTION OF THE EMBODIMENTS

Generally speaking, a memory storage device (also referred to as a memory storage system) includes a rewritable non-volatile memory module and a controller (also referred to as a control circuit). The memory storage device may be used together with a host system, so that the host system may write data to the memory storage device or read data from the memory storage device.

Figure 1:
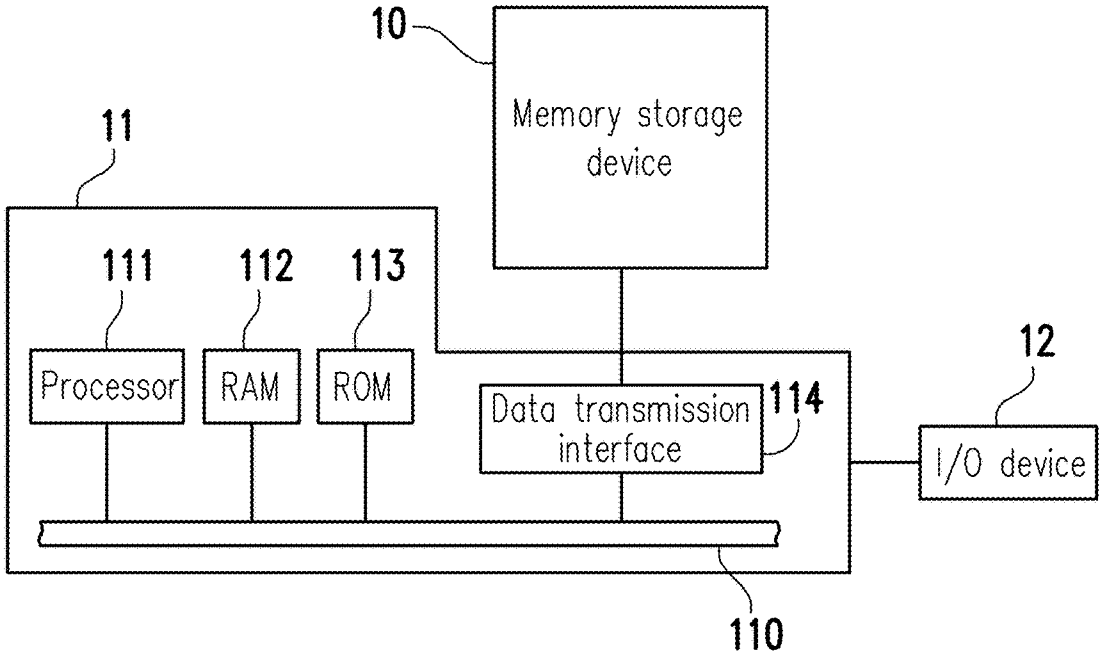
FIG. 1 is a schematic diagram of a host system, a memory storage device, and an input/output (I/O) device according to an exemplary embodiment of the disclosure.
Figure 2:
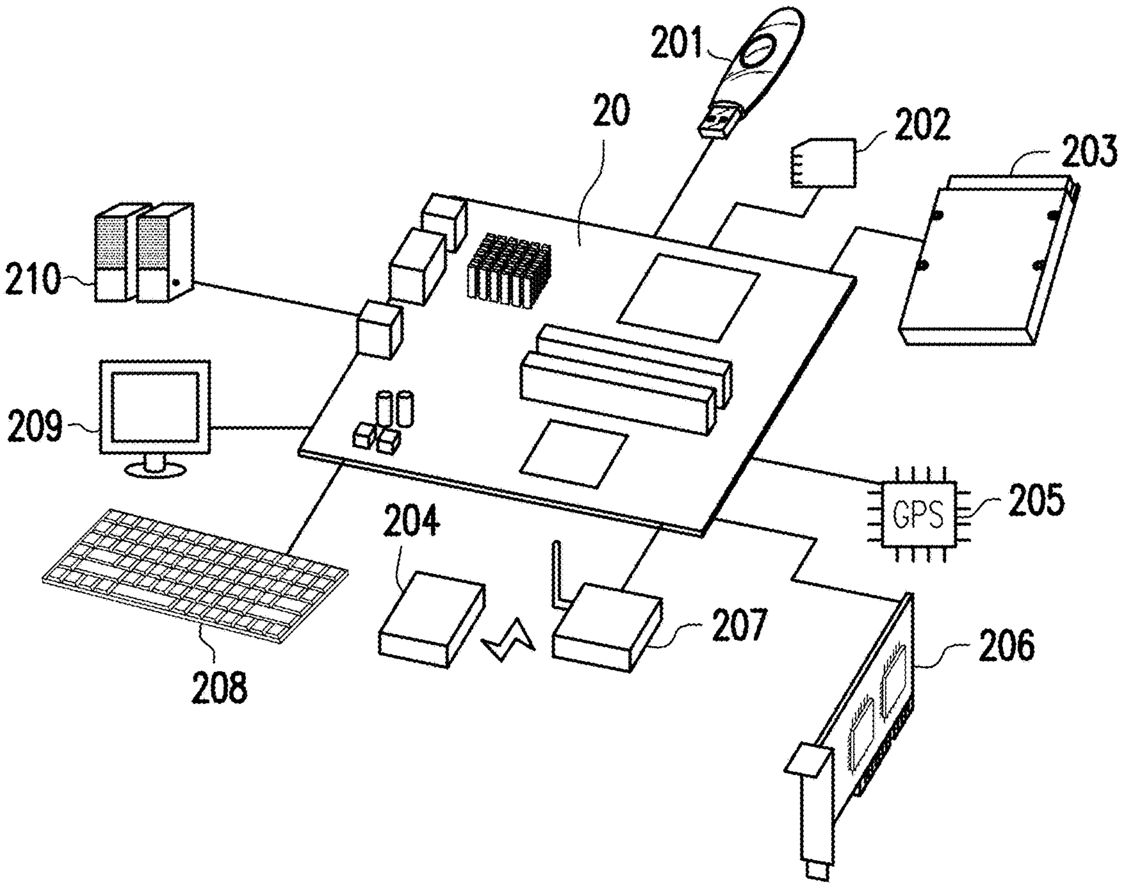
FIG. 2 is a schematic diagram of a host system, a memory storage device, and an I/O device according to an exemplary embodiment of the disclosure.

FIG. 1 is a schematic diagram of a host system, a memory storage device, and an input/output (I/O) device according to an exemplary embodiment of the disclosure. FIG. 2 is a schematic diagram of a host system, a memory storage device, and an I/O device according to an exemplary embodiment of the disclosure.

Please refer to FIG. 1 and FIG. 2. A host system 11 may include a processor 111, a random access memory (RAM) 112, a read only memory (ROM) 113, and a data transmission interface 114. The processor 111, the random access memory 112, the read only memory 113, and the data transmission interface 114 may be coupled to a system bus 110.

In an exemplary embodiment, the host system 11 may be coupled to the memory storage device 10 through the data transmission interface 114. For example, the host system 11 may store data into the memory storage device 10 or read data from the memory storage device 10 via the data transmission interface 114. In addition, the host system 11 may be coupled to the I/O device 12 through the system bus 110. For example, the host system 11 may send an output signal to the I/O device 12 or receive an input signal from the I/O device 12 via the system bus 110.

In an exemplary embodiment, the processor 111, the random access memory 112, the read only memory 113, and the data transmission interface 114 may be disposed on a motherboard 20 of the host system 11. The number of the data transmission interface 114 may be one or more. Through the data transmission interface 114, the motherboard 20 may be coupled to the memory storage device 10 via a wired or wireless manner.

In an exemplary embodiment, the memory storage device 10 may be, for example, a flash drive 201, a memory card 202, a solid state drive (SSD) 203, or a wireless memory storage device 204. The wireless memory storage device 204 may be, for example, a near field communication (NFC) memory storage device, a WiFi memory storage device, a Bluetooth memory storage device, a low-power Bluetooth memory storage device (for example, iBeacon), or other memory storage devices based on various wireless communication technologies. In addition, the motherboard 20 may also be coupled to a global positioning system (GPS) module 205, a network interface card 206, a wireless transmission device 207, a keyboard 208, a screen 209, a speaker 210, or various other I/O devices through the system bus 110. For example, in an exemplary embodiment, the motherboard 20 may access the wireless memory storage device 204 through the wireless transmission device 207.

In an exemplary embodiment, the host system 11 is a computer system. In an exemplary embodiment, the host system 11 may be any system that may substantially cooperate with a memory storage device to store data. In an exemplary embodiment, the memory storage device 10 and the host system 11 may respectively include a memory storage device 30 and a host system 31 of FIG. 3.

Figure 3:
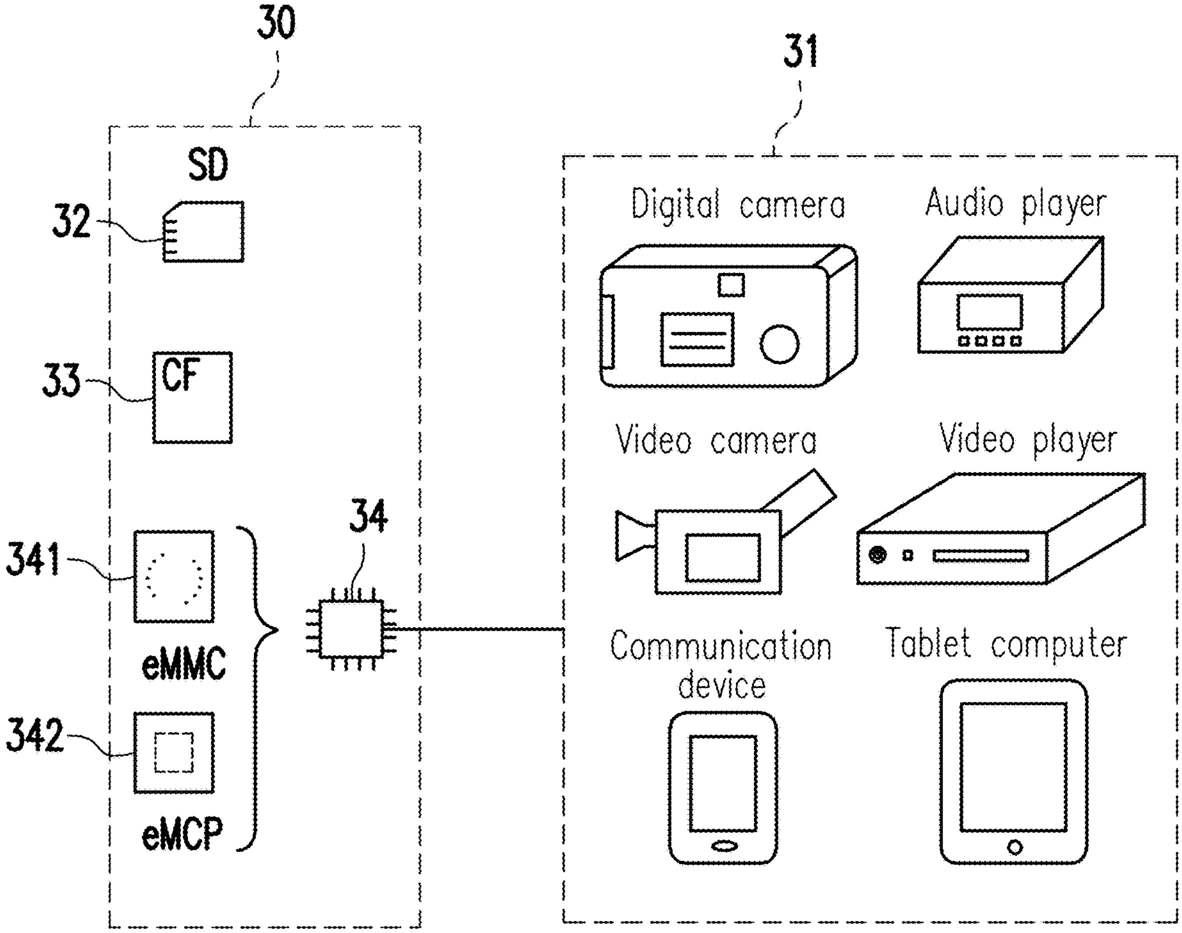
FIG. 3 is a schematic diagram of a host system and a memory storage device according to an exemplary embodiment of the disclosure.

FIG. 3 is a schematic diagram of a host system and a memory storage device according to an exemplary embodiment of the disclosure. Please refer to FIG. 3. The memory storage device 30 may be used in conjunction with the host system 31 to store data. For example, the host system 31 may be a digital camera, a video camera, a communication device, an audio player, a video player, a tablet computer, or other systems. For example, the memory storage device 30 may be a secure digital (SD) card 32, a compact flash (CF) card 33, an embedded storage device 34, or various other non-volatile memory storage devices used by the host system 31. The embedded storage device 34 includes an embedded multi media card (eMMC) 341, an embedded multi chip package (eMCP) storage device 342, and/or various other embedded storage devices in which a memory module is directly coupled onto a substrate of a host system.

Figure 4A:
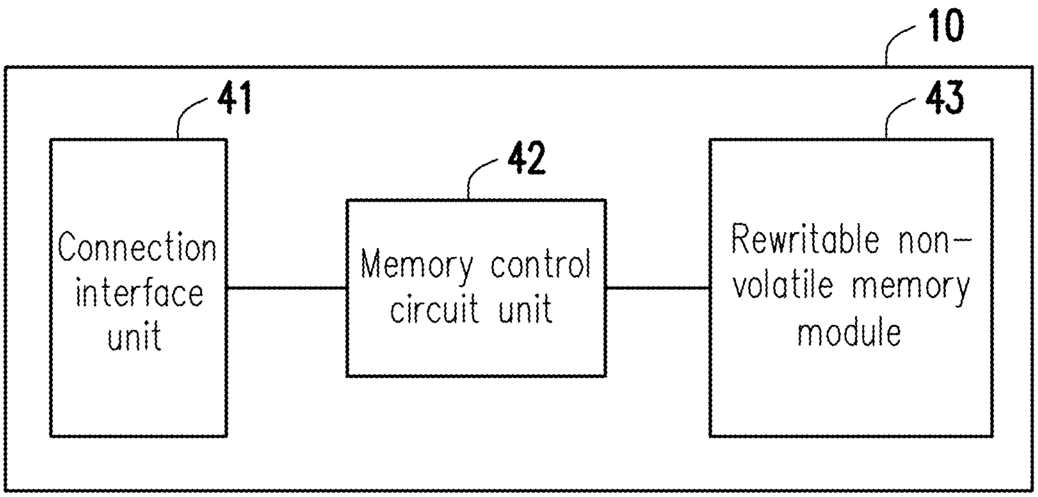
FIG. 4A is a schematic diagram of a memory storage device according to an exemplary embodiment of the disclosure.

FIG. 4A is a schematic diagram of a memory storage device according to an exemplary embodiment of the disclosure. Please refer to FIG. 4A. The memory storage device 10 includes a connection interface unit 41, a memory control circuit unit 42, and a rewritable non-volatile memory module 43.

The connection interface unit 41 is configured to couple to the host system 11. The memory storage device 10 may communicate with the host system 11 via the connection interface unit 41. In an exemplary embodiment, the connection interface unit 41 is compatible with the peripheral component interconnect express (PCI express) standard. In an exemplary embodiment, the connection interface unit 41 may also conform to the serial advanced technology attachment (SATA) standard, the parallel advanced technology attachment (PATA) standard, the Institute of Electrical and Electronic Engineers (IEEE) 1394 standard, the universal serial bus (USB) standard, the SD interface standard, the ultra high speed-I (UHS-I) interface standard, the ultra high speed-II (UHS-II) interface standard, the memory stick (MS) interface standard, the MCP interface standard, the MMC interface standard, the eMMC interface standard, the universal flash storage (UFS) interface standard, the eMCP interface standard, the CF interface standard, the integrated device electronics (IDE) standard, or other suitable standards. The connection interface unit 41 and the memory control circuit unit 42 may be packaged in one chip or the connection interface unit 41 may be arranged outside a chip including the memory control circuit unit 42.

The memory control circuit unit 42 is coupled to the connection interface unit 41 and the rewritable non-volatile memory module 43. The memory control circuit unit 42 is configured to execute multiple logic gates or control commands implemented in the form of hardware or the form of firmware and perform operations such as data writing, reading, and erasing in the rewritable non-volatile memory module 43 according to a command of the host system 11.

The rewritable non-volatile memory module 43 is configured to store data written by the host system 11. The rewritable non-volatile memory module 43 may include a single level cell (SLC) NAND flash memory module (that is, a flash memory module that may store 1 bit in a memory cell), a multi level cell (MLC) NAND flash memory module (that is, a flash memory module that may store 2 bits in a memory cell), a triple level cell (TLC) NAND flash memory module (that is, a flash memory module that may store 3 bits in a memory cell), a quad level cell (QLC) NAND flash memory module (that is, a flash memory module that may store 4 bits in a memory cell), other flash memory modules, or other memory modules with the same characteristics.

Each memory cell in the rewritable non-volatile memory module 43 stores one or more bits with changes in voltage (hereinafter also referred to as a threshold voltage). Specifically, there is a charge trapping layer between a control gate and a channel of each memory cell. Through applying a write voltage to the control gate, the number of electrons in the charge trapping layer may be changed, thereby changing the threshold voltage of the memory cell. The operation of changing the threshold voltage of the memory cell is also referred to as "writing data to the memory cell" or "programming the memory cell". As the threshold voltage changes, each memory cell in the rewritable non-volatile memory module 43 has multiple storage statuses. Through applying a read voltage, it is possible to judge which storage status a memory cell belongs to, so as to obtain one or more bits stored in the memory cell.

In an exemplary embodiment, the memory cells of the rewritable non-volatile memory module 43 may constitute multiple physical programming units, and the physical programming units may constitute multiple physical erasing units. Specifically, the memory cells on the same word line may form one or more physical programming units. If one memory cell may store more than 2 bits, the physical programming units on the same word line may be at least classified into a lower physical programming unit and an upper physical programming unit. For example, a least significant bit (LSB) of a memory cell belongs to the lower physical programming unit, and a most significant bit (MSB) of a memory cell belongs to the upper physical programming unit. Generally speaking, in the MLC NAND flash memory, the write speed of the lower physical programming unit is greater than the write speed of the upper physical programming unit and/or the reliability of the lower physical programming unit is higher than the reliability of the upper physical programming unit.

In an exemplary embodiment, the physical programming unit is the smallest unit of programming. That is, the physical programming unit is the smallest unit of writing data. For example, the physical programming unit may be a physical page or a physical sector. If the physical programming unit is a physical page, the physical programming units may include a data bit area and a redundancy bit area. The data bit area includes multiple physical sectors for storing user data, and the redundancy bit area is configured to store system data (for example, management data such as an error correcting code). In an exemplary embodiment, the data bit area includes 32 physical sectors, and the size of one physical sector is 512 bytes (B). However, in other exemplary embodiments, the data bit area may also include 8, 16, more, or less physical sectors, and the size of each physical sector may also be greater or smaller. On the other hand, the physical erasing unit is the smallest unit of erasure. That is, each physical erasing unit includes the smallest number of memory cells to be erased together. For example, the physical erasing unit is a physical block.

Figure 4B:
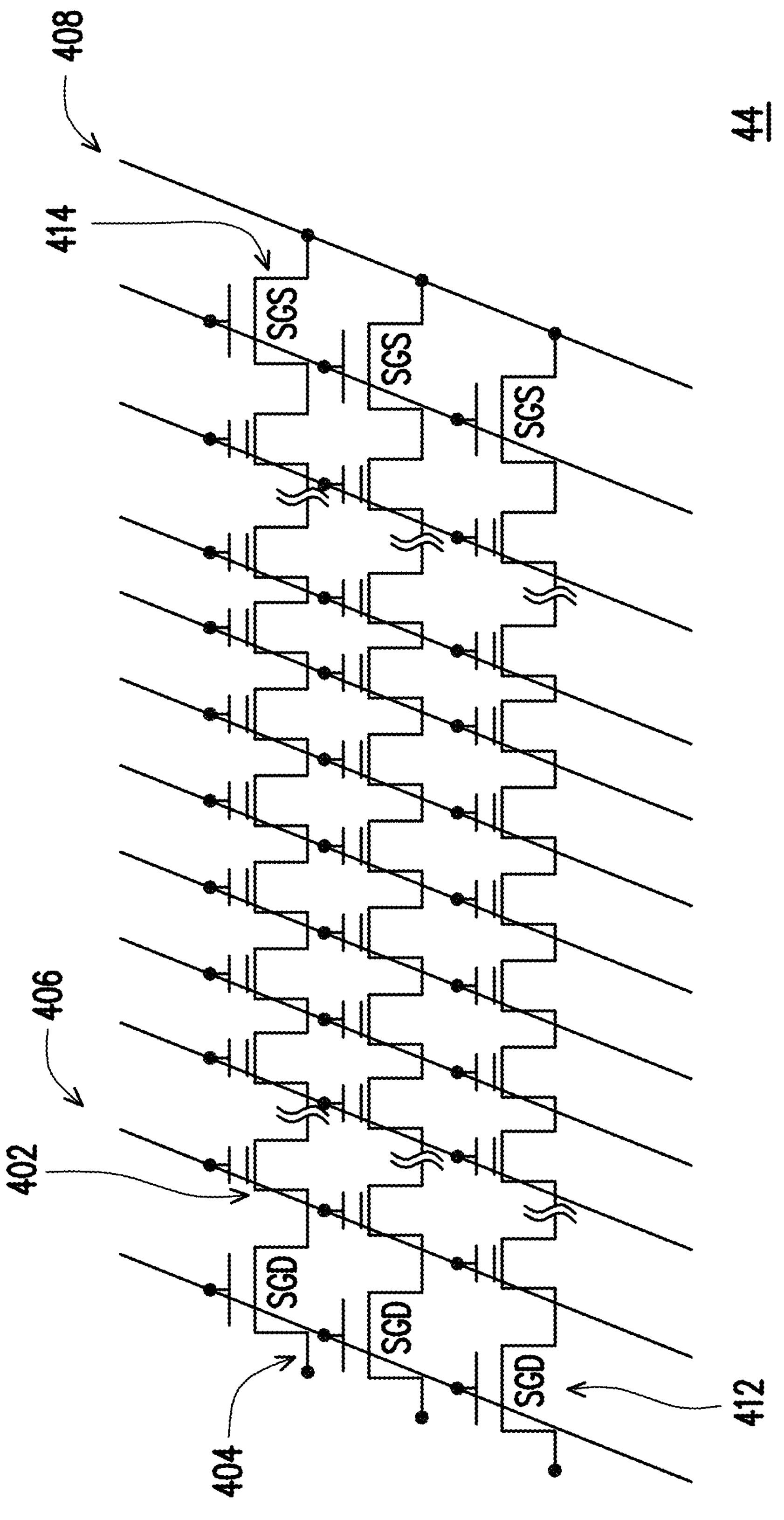
FIG. 4B is a schematic diagram of a memory cell array according to an exemplary embodiment of the disclosure.

FIG. 4B is a schematic diagram of a memory cell array according to an exemplary embodiment of the disclosure. Please refer to FIG. 4B, a memory cell array 44 includes multiple memory cells 402 for storing data, multiple select gate drain (SGD) transistors 412 and multiple select gate source (SGS) transistors 414, multiple bit lines 404 connecting the memory cells 402, multiple word lines 406, and a common source line 408. In particular, the memory cells 402 are disposed in an array at intersections of the bit lines 404 and the word lines 406, as shown in FIG. 4B. In addition, the rewritable non-volatile memory module 43 may include multiple memory cell arrays 44. The memory cell arrays 44 may be horizontally and/or vertically stacked.

Figure 5:
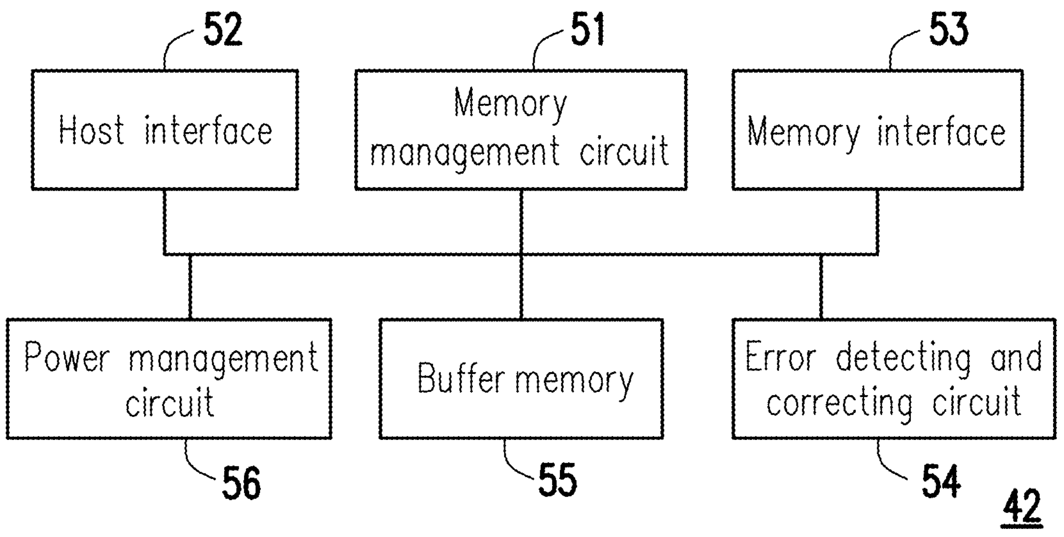
FIG. 5 is a schematic diagram of a memory control circuit unit according to an exemplary embodiment of the disclosure.

FIG. 5 is a schematic diagram of a memory control circuit unit according to an exemplary embodiment of the disclosure. Please refer to FIG. 5. The memory control circuit unit 42 includes a memory management circuit 51, a host interface 52, and a memory interface 53.

The memory management circuit 51 is configured to control the overall operation of the memory control circuit unit 42. Specifically, the memory management circuit 51 has multiple control commands, and when the memory storage device 10 is operating, the control commands are executed to perform operations such as data writing, reading, and erasing. The following description of the operation of the memory management circuit 51 is equivalent to the description of the operations of the memory control circuit unit 42 and the memory storage device 10.

In an exemplary embodiment, the control commands of the memory management circuit 51 are implemented in the form of firmware. For example, the memory management circuit 51 has a microprocessor unit (not shown) and a read only memory (not shown), and the control commands are burnt into the read only memory. When the memory storage device 10 is operating, the control commands are executed by the microprocessor unit to perform operations such as data writing, reading, and erasing.

In an exemplary embodiment, the control commands of the memory management circuit 51 may also be stored in a specific region (for example, a system area dedicated to storing system data in a memory module) of the rewritable non-volatile memory module 43 in the form of program codes. In addition, the memory management circuit 51 has a microprocessor unit (not shown), a read only memory (not shown), and a random access memory (not shown). In particular, the read only memory has a boot code, and when the memory control circuit unit 42 is enabled, the microprocessor unit first executes the boot code to load the control commands stored in the rewritable non-volatile memory module 43 into the random access memory of the memory management circuit 51. After that, the microprocessor unit runs the control commands to perform operations such as data writing, reading, and erasing.

In an exemplary embodiment, the control commands of the memory management circuit 51 may also be implemented in the form of hardware. For example, the memory management circuit 51 includes a microcontroller, a memory cell management circuit, a memory write circuit, a memory read circuit, a memory erase circuit, and a data processing circuit. The memory cell management circuit, the memory write circuit, the memory read circuit, the memory erase circuit, and the data processing circuit are coupled to the microcontroller. The memory cell management circuit is configured to manage a memory cell or a memory cell group of the rewritable non-volatile memory module 43. The memory write circuit is configured to issue a write command sequence to the rewritable non-volatile memory module 43 to write data to the rewritable non-volatile memory module 43. The memory read circuit is configured to issue a read command sequence to the rewritable non-volatile memory module 43 to read data from the rewritable non-volatile memory module 43. The memory erase circuit is configured to issue an erase command sequence to the rewritable non-volatile memory module 43 to erase data from the rewritable non-volatile memory module 43. The data processing circuit is configured to process data to be written to the rewritable non-volatile memory module 43 and data read from the rewritable non-volatile memory module 43. The write command sequence, the read command sequence, and the erase command sequence may individually include one or more program codes or command codes and are configured to instruct the rewritable non-volatile memory module 43 to execute corresponding operations such as writing, reading, and erasing. In an exemplary embodiment, the memory management circuit 51 may also issue other types of command sequences to the rewritable non-volatile memory module 43 to instruct to execute corresponding operations.

The host interface 52 is coupled to the memory management circuit 51. The memory management circuit 51 may communicate with the host system 11 through the host interface 52. The host interface 52 may be configured to acquire and identify commands and data of the host system 11. For example, the commands and the data of the host system 11 may be sent to the memory management circuit 51 through the host interface 52. In addition, the memory management circuit 51 may send the data to the host system 11 through the host interface 52. In the exemplary embodiment, the host interface 52 is compatible with the PCI express standard. However, it must be understood that the disclosure is not limited thereto. The host interface 52 may also be compatible with the SATA standard, the PATA standard, the IEEE 1394 standard, the USB standard, the SD standard, the UHS-I standard, the UHS-II standard, the MS standard, the MMC standard, the eMMC standard, the UFS standard, the CF standard, the IDE standard, or other suitable data transmission standards.

The memory interface 53 is coupled to the memory management circuit 51 and is configured to access the rewritable non-volatile memory module 43. For example, the memory management circuit 51 may access the rewritable non-volatile memory module 43 through the memory interface 53. In other words, data to be written to the rewritable non-volatile memory module 43 is converted into a format acceptable by the rewritable non-volatile memory module 43 via the memory interface 53. Specifically, if the memory management circuit 51 intends to access the rewritable non-volatile memory module 43, the memory interface 53 will send the corresponding command sequence. For example, the command sequences may include the write command sequence instructing to write data, the read command sequence instructing to read data, the erase command sequence instructing to erase data, and corresponding command sequences instructing various memory operations (such as changing a read voltage level or executing a garbage collection (GC) operation). The command sequences are, for example, generated by the memory management circuit 51 and sent to the rewritable non-volatile memory module 43 through the memory interface 53. The command sequences may include one or more signals or data on a bus. The signals or the data may include command codes or program codes. For example, the read command sequence includes information such as a read recognition code and a memory address.

In an exemplary embodiment, the memory control circuit unit 42 further includes an error detecting and correcting circuit 54, a buffer memory 55, and a power management circuit 56.

The error detecting and correcting circuit 54 is coupled to the memory management circuit 51 and is configured to execute error detecting and correcting operations to ensure correctness of data. Specifically, when the memory management circuit 51 acquires a write command from the host system 11, the error detecting and correcting circuit 54 generates a corresponding error correcting code (ECC) and/or error detecting code (EDC) for data corresponding to the write command, and the memory management circuit 51 writes the data corresponding to the write command and the corresponding error correcting code and/or error detecting code to the rewritable non-volatile memory module 43. Later, when the memory management circuit 51 reads the data from the rewritable non-volatile memory module 43, the error correcting code and/or the error detecting code corresponding to the data are read at the same time, and the error detecting and correcting circuit 54 executes the error detecting and correcting operations on the read data according to the error correcting code and/or the error detecting code. For example, the error detecting and correcting circuit 54 may adopt a low density parity check (LDPC) code, BCH code, Reed-Solomon (RS) code, exclusive OR (XOR) code, or other types of encoding/decoding algorithms to execute data encoding and decoding.

The buffer memory 55 is coupled to the memory management circuit 51 and is configured to temporarily store data. The power management circuit 56 is coupled to the memory management circuit 51 and is configured to control the power of the memory storage device 10.

In an exemplary embodiment, the rewritable non-volatile memory module 43 of FIG. 4 may include a flash memory module. In an exemplary embodiment, the memory control circuit unit 42 of FIG. 4 may include a flash memory controller. In an exemplary embodiment, the memory management circuit 51 of FIG. 5 may include a flash memory management circuit.

Figure 6:
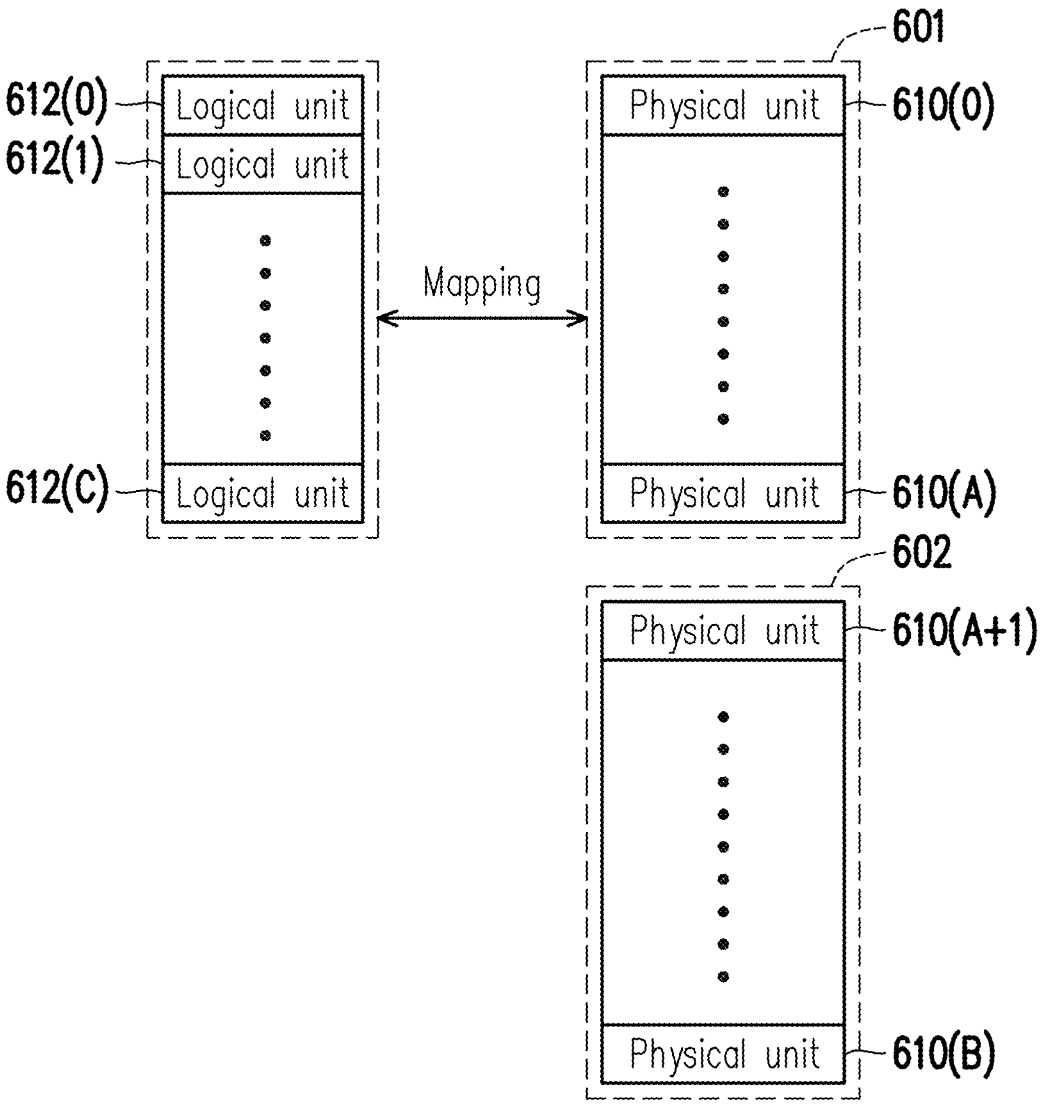
FIG. 6 is a schematic diagram of managing a rewritable non-volatile memory module according to an exemplary embodiment of the disclosure.

FIG. 6 is a schematic diagram of managing a rewritable non-volatile memory module according to an exemplary embodiment of the disclosure. Please refer to FIG. 6. The memory management circuit 51 may logically group physical units 610(0) to 610(B) in the rewritable non-volatile memory module 43 into a storage area 601 and a spare area 602.

In an exemplary embodiment, a physical unit refers to a physical address or a physical programing unit. In an exemplary embodiment, a physical unit includes multiple memory cells located on the same word line. In an exemplary embodiment, a physical unit may also be composed of multiple continuous or discontinuous physical addresses. In an exemplary embodiment, a physical unit may also refer to a virtual block (VB). A virtual block may include multiple physical addresses or multiple physical programming units. In an exemplary embodiment, a virtual block may include one or more physical erase units.

In an exemplary embodiment, the physical units 610(0) to 610(A) in the storage area 601 are configured to store user data (for example, the user data of the host system 11 of FIG. 1). For example, the physical units 610(0) to 610(A) in the storage area 601 may store valid data and invalid data. The physical units 610(A+1) to 610(B) in the spare area 602 do not store data (for example, valid data). For example, if a certain physical unit does not store valid data, the physical unit may be associated (or added) to the spare area 602. In addition, the physical units (or the physical units that do not store valid data) in the spare area 602 may be erased. When writing new data, one or more physical units may be extracted from the spare area 602 to store the new data. In an exemplary embodiment, the spare area 602 is also referred to as a free pool.

In an exemplary embodiment, the memory management circuit 51 may be configured with logical units 612(0) to 612(C) to map the physical units 610(0) to 610(A) in the storage area 601. In an exemplary embodiment, each logical unit corresponds to one logical address. For example, one logical address may include one or more logical block addresses (LBA) or other logical management units. In an exemplary embodiment, one logical unit may also correspond to one logical programming unit or be composed of multiple continuous or discontinuous logical addresses.

It should be noted that one logical unit may be mapped to one or more physical units. If a certain physical unit is currently mapped by a certain logical unit, it means that data currently stored in the physical unit includes valid data. Conversely, if a certain physical unit is not currently mapped by any logical unit, it means that data currently stored in the physical unit is invalid data.

In an exemplary embodiment, the memory management circuit 51 may record management data (also referred to as logical-to-physical mapping information) describing a mapping relationship between the logical unit and the physical unit in at least one logical-to-physical mapping table (L2P table). When the host system 11 intends to read data from the memory storage device 10 or write data to the memory storage device 10, the memory management circuit 51 may access the rewritable non-volatile memory module 43 according to the information in the logical-to-physical mapping table.

In an exemplary embodiment, the memory management circuit 51 may detect the status of the rewritable non-volatile memory module 43. In an exemplary embodiment, the memory management circuit 51 may detect the status of the rewritable non-volatile memory module 43 to obtain a wear evaluation value. The wear evaluation value may reflect the wear status of the rewritable non-volatile memory module 43. For example, the wear evaluation value may be positively correlated with the degree of wear of the rewritable non-volatile memory module 43. That is, the greater the wear evaluation value, the higher the degree of wear of the rewritable non-volatile memory module 43.

In an exemplary embodiment, the memory management circuit 51 may obtain the wear evaluation value according to parameters (also referred to as status parameters) related to the status of the rewritable non-volatile memory module 43, such as a read count, a programming count, an erase count, a bit error rate, and/or a temperature value. The read count may reflect the number of times a read operation is executed on at least one physical unit in the rewritable non-volatile memory module 43. For example, the read operation is configured to read data from the at least one physical unit. The programming count may reflect the number of times a programming operation is executed on at least one physical unit in the rewritable non-volatile memory module 43. For example, the programming operation is configured to write data to the at least one physical unit. The erase count may reflect the number of times an erase operation is executed on at least one physical unit in the rewritable non-volatile memory module 43. For example, the erase operation is configured to erase data stored in the at least one physical unit. The bit error rate may reflect the degree of healthiness of at least one physical unit in the rewritable non-volatile memory module 43. For example, the bit error rate may be positively correlated with the total number of error bits included in the data read from the at least one physical unit. The temperature value may reflect the temperature of the rewritable non-volatile memory module 43 (or the memory storage device 10).

In an exemplary embodiment, the memory management circuit 51 may obtain the wear evaluation value according to at least one of the various status parameters above. In an exemplary embodiment, the memory management circuit 51 may directly set the wear evaluation value according to at least one of the various status parameters (for example, the read count, the programming count, the erase count, the bit error rate, or the temperature value) to reflect the current status of the rewritable non-volatile memory module 43. Alternatively, in an exemplary embodiment, the memory management circuit 51 may perform a logical operation on at least one of the various status parameters above to obtain the wear evaluation value, which is not limited by the disclosure.

In an exemplary embodiment, the memory management circuit 51 may judge whether the status of the rewritable non-volatile memory module 43 meets a specific condition (also referred to as a first condition). In an exemplary embodiment, the memory management circuit 51 may compare the wear evaluation value with a threshold value (also referred to as a first threshold value). In response to the wear evaluation value reaching (such as being greater than or equal to) the first threshold value, the memory management circuit 51 may judge that the status of the rewritable non-volatile memory module 43 meets the first condition. However, if the wear evaluation value does not reach (such as being less than) the first threshold value, the memory management circuit 51 may judge that the status of the rewritable non-volatile memory module 43 does not meet the first condition.

In an exemplary embodiment, in response to the status of the rewritable non-volatile memory module 43 meeting the first condition, the memory management circuit 51 may send a read command (also referred to as a single-state read command) to the rewritable non-volatile memory module 43. The single-state read command may be configured to instruct the rewritable non-volatile memory module 43 to read a specific physical unit (also referred to as a first physical unit) in the rewritable non-volatile memory module 43 based on a specific voltage. In particular, the specific voltage is different from a read voltage corresponding to the first physical unit.

In an exemplary embodiment, after receiving the single-state read command, the rewritable non-volatile memory module 43 may apply the specific voltage to each memory cell in the first physical unit. According to the pass status of each memory cell in the first physical unit in response to the specific voltage, the rewritable non-volatile memory module 43 may use multiple bits (also referred to as identification bits) as a read result of the single-state read command to be returned to the memory management circuit 51.

In an exemplary embodiment, each identification bit may reflect the pass status of a specific memory cell in the first physical unit in response to the specific voltage. For example, each identification bit may reflect whether the threshold voltage of the specific memory cell in the first physical unit is greater than the specific voltage.

In an exemplary embodiment, the memory management circuit 51 may adjust at least one electrical parameter of the rewritable non-volatile memory module 43 (that is, dynamically adjust at least one electrical parameter of the rewritable non-volatile memory module 43) according to the read result (that is, the identification bits) of the single-state read command. More specifically, in an exemplary embodiment, the memory management circuit 51 may determine whether to dynamically adjust at least one electrical parameter of the rewritable non-volatile memory module 43 according to the read result of the single-state read command.

In an exemplary embodiment, the memory management circuit 51 may judge whether the total number of multiple read specific bits (also referred to as target bits) reaches (such as being greater than or equal to) a threshold value (also referred to as a second threshold value) according to the read result of the single-state read command. In response to the total number of the read target bits reaching the second threshold value, the memory management circuit 51 may dynamically adjust at least one electrical parameter of the rewritable non-volatile memory module 43. However, if the total number of the read target bits does not reach (such as being less than) the second threshold value, the memory management circuit 51 may not dynamically adjust at least one electrical parameter of the rewritable non-volatile memory module 43.

In an exemplary embodiment, among the identification bits, the total number of the target bits may reflect the total number of at least one memory cell (also referred to as target memory cell) in the first physical unit. In particular, the threshold voltage of each target memory cell is greater than the specific voltage instructed by the single-state read command. For example, in an exemplary embodiment, the target bit may refer to bit "1" among the identification bits. However, in an exemplary embodiment, the target bit may also refer to bit "0" among the identification bits, as long as the total number of the target bits may reflect the total number of the target memory cells in the first physical unit.

In an exemplary embodiment, when dynamically adjusting at least one electrical parameter of the rewritable non-volatile memory module 43, an adjustable electrical parameter of the memory management circuit 51 includes at least one of a programming voltage corresponding to the first physical unit, a programming pass voltage corresponding to the first physical unit, an erase voltage corresponding to the first physical unit, an erase verification voltage corresponding to the first physical unit, and a read pass voltage corresponding to the first physical unit.

It should be noted that the programming voltage corresponding to the first physical unit is configured to be applied to each memory cell in the first physical unit during a period of executing the programming operation on the first physical unit to write data to the first physical unit. The programming pass voltage corresponding to the first physical unit is configured to be applied to each memory cell in the first physical unit during a period of executing the programming operation on other physical units (excluding the first physical unit) in the rewritable non-volatile memory module 43. The erase voltage corresponding to the first physical unit is configured to be applied to each memory cell in the first physical unit during a period of executing the erase operation on the first physical unit to erase data from the first physical unit. The erase verification voltage corresponding to the first physical unit is configured to be applied to each memory cell in the first physical unit during a period of executing the erase operation on the first physical unit to confirm whether the current erase operation on the first physical unit is completed. In addition, the read pass voltage corresponding to the first physical unit is configured to be applied to the first physical unit during a period of executing the read operation on other physical units (excluding the first physical unit) in the rewritable non-volatile memory module 43 to conduct each memory cell in the first physical unit.

In an exemplary embodiment, the specific voltage instructed by the single-state read command includes the read pass voltage corresponding to the first physical unit. That is, in an exemplary embodiment, in response to the status of the rewritable non-volatile memory module 43 meeting the first condition, the memory management circuit 51 may send the single-state read command to the rewritable non-volatile memory module 43 to instruct the rewritable non-volatile memory module 43 to read the first physical unit based on the read pass voltage corresponding to the first physical unit. However, in an exemplary embodiment, the specific voltage may also be adjusted according to practical requirements, which is not limited by the disclosure.

In an exemplary embodiment, when dynamically adjusting at least one electrical parameter of the rewritable non-volatile memory module 43, the memory management circuit 51 may execute at least one of the following operations of reducing the programming voltage corresponding to the first physical unit, reducing the programming pass voltage corresponding to the first physical unit, reducing the erase voltage corresponding to the first physical unit, increasing the erase verification voltage corresponding to the first physical unit, and increasing the read pass voltage corresponding to the first physical unit.

In an exemplary embodiment, when the rewritable non-volatile memory module 43 (or the memory storage device 10) is first leaves the factory, the read pass voltage corresponding to each physical unit (including the first physical) in the rewritable non-volatile memory module 43 is the same (also referred to as a default read pass voltage). In an exemplary embodiment, when dynamically adjusting at least one electrical parameter of the rewritable non-volatile memory module 43, the memory management circuit 51 may adjust the read pass voltage corresponding to the first physical unit to be higher than the default read pass voltage.

In an exemplary embodiment, through dynamically adjusting at least one electrical parameter of the rewritable non-volatile memory module 43, even if the rewritable non-volatile memory module 43 is in an operating environment where a large amount of data is accessed (especially a large amount of data is written), the reliability of the rewritable non-volatile memory module 43 can be effectively improved and/or the service life of the rewritable non-volatile memory module 43 can be effectively extended.

In an exemplary embodiment, the specific voltage instructed by the single-state read command may be the default read pass voltage or the adjusted read pass voltage corresponding to the first physical unit. For example, in an exemplary embodiment, after adjusting the read pass voltage corresponding to the first physical unit to be higher than the default read pass voltage, the specific voltage instructed by the single-state read command may still be the default read pass voltage. Alternatively, in an exemplary embodiment, after adjusting the read pass voltage corresponding to the first physical unit to be higher than the default read pass voltage, the specific voltage instructed by the single-state read command may be the adjusted read pass voltage corresponding to the first physical unit.

In an exemplary embodiment, when executing the single-state read command on the first physical unit, other physical units (excluding the first physical unit) must also be provided with the read pass voltage, and the read pass voltage provided to other physical units may be the default read pass voltage or the adjusted read pass voltage. In detail, when executing the single-state read command on the first physical unit, the same default read pass voltage may be synchronously provided to the first physical unit and other physical units or the same adjusted read pass voltage may be synchronously provided to the first physical unit and other physical units.

Figure 7:
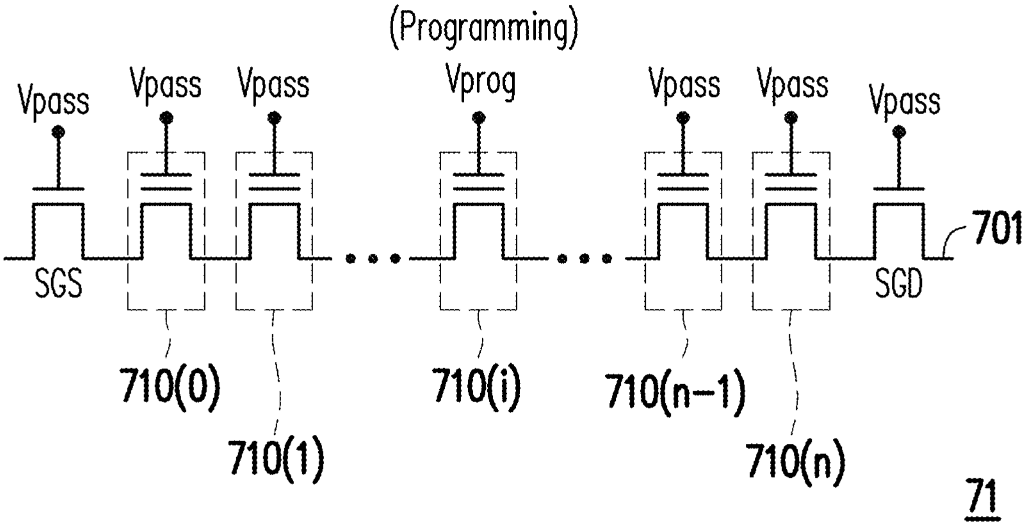
FIG. 7 is a schematic diagram of executing a programming operation on a first physical unit according to an exemplary embodiment of the disclosure.

FIG. 7 is a schematic diagram of executing a programming operation on a first physical unit according to an exemplary embodiment of the disclosure. Please refer to FIG. 7. It is assumed that a memory cell array 71 includes physical units 710(0) to 710(*n*). The physical units 710(0) to 710(*n*) are connected to each other through a bit line 701. Furthermore, it is assumed that the first physical unit includes the physical unit 710(*i*), and a second physical unit includes the physical unit 710(0).

In an exemplary embodiment, during a period of executing the programming operation on the physical unit 710(*i*), a programming voltage Vprog corresponding to the physical unit 710(*i*) may be applied to each memory cell (for example, a control gate of the memory cell) in the physical unit 710(*i*) to write data to the physical unit 710(*i*). At the same time, a programming pass voltage Vpass corresponding to the physical unit 710(0) may be applied to the physical unit 710(0).

Figure 8:
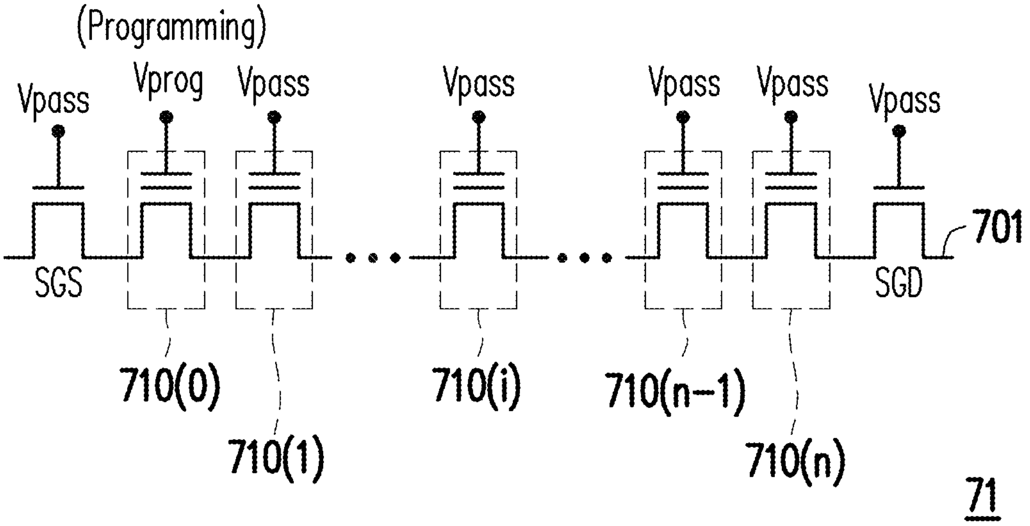
FIG. 8 is a schematic diagram of executing a programming operation on a second physical unit according to an exemplary embodiment of the disclosure.

FIG. 8 is a schematic diagram of executing a programming operation on a second physical unit according to an exemplary embodiment of the disclosure. Please refer to FIG. 8. In an exemplary embodiment, during a period of executing the programming operation on the physical unit 710(0), the programming pass voltage Vpass corresponding to the physical unit 710(*i*) may be applied to each memory cell (for example, the control gate of the memory cell) in the physical unit 710(*i*).

Figure 9:
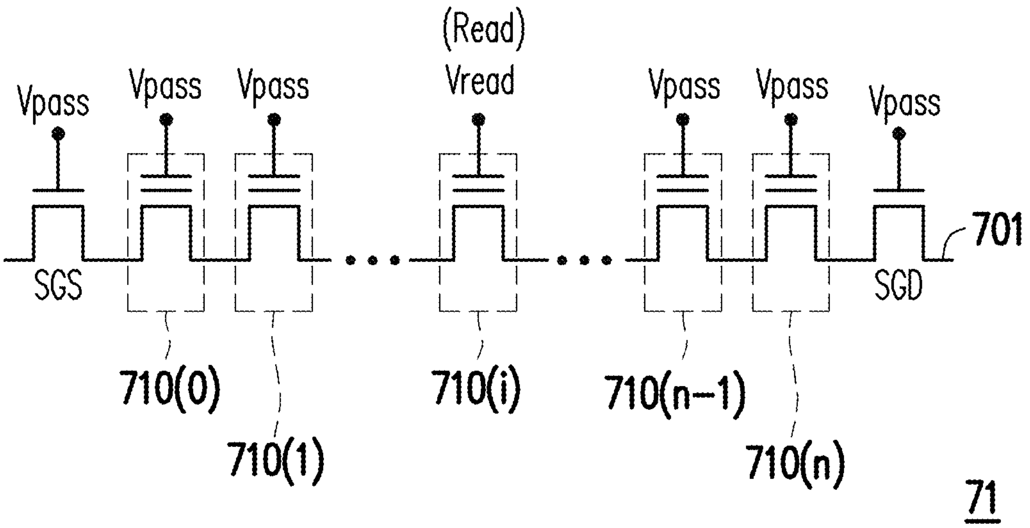
FIG. 9 is a schematic diagram of executing a read operation on the first physical unit according to an exemplary embodiment of the disclosure.

FIG. 9 is a schematic diagram of executing a read operation on the first physical unit according to an exemplary embodiment of the disclosure. Please refer to FIG. 9. In an exemplary embodiment, during a period of executing the read operation on the physical unit 710(*i*), a read voltage Vread corresponding to the physical unit 710(*i*) may be applied to each memory cell (for example, the control gate of the memory cell) in the physical unit 710(*i*) to read data from the physical unit 710(*i*). At the same time, the read pass voltage Vpass corresponding to the physical unit 710(0) may be applied to the physical unit 710(0).

Figure 10:
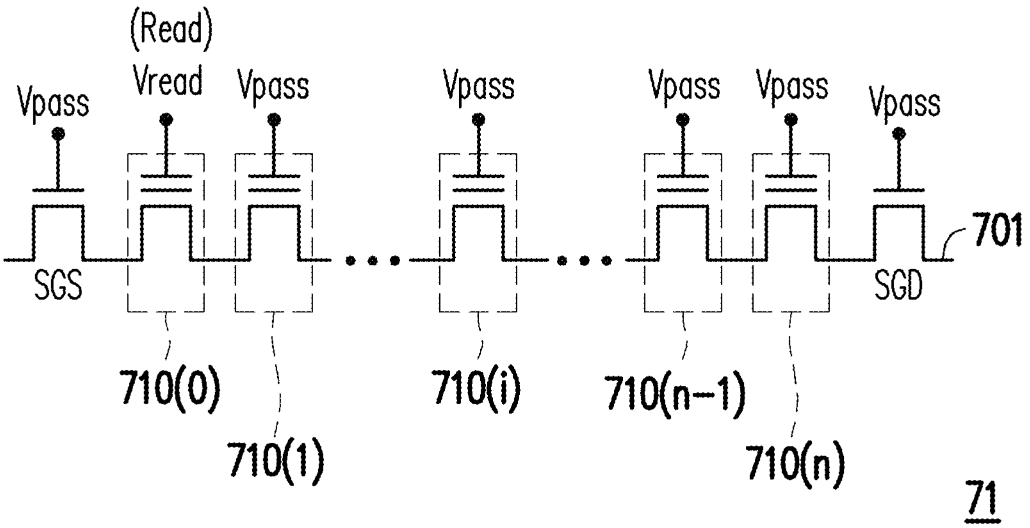
FIG. 10 is a schematic diagram of executing a read operation on the second physical unit according to an exemplary embodiment of the disclosure.

FIG. 10 is a schematic diagram of executing a read operation on the second physical unit according to an exemplary embodiment of the disclosure. Please refer to FIG. 10. In an exemplary embodiment, during a period of executing the read operation on the physical unit 710(0) (that is, the second physical unit), the read pass voltage Vpass corresponding to the physical unit 710(*i*) may be applied to each memory cell (for example, the control gate of the memory cell) in the physical unit 710(*i*).

In an exemplary embodiment, during the period of executing the read operation on the physical unit 710(0), the read pass voltage Vpass applied to the physical unit 710(*i*) may be equal to the default read pass voltage corresponding to each physical unit in the rewritable non-volatile memory module 43. However, in an exemplary embodiment, during the period of executing the read operation on the physical unit 710(0), the read pass voltage Vpass applied to the physical unit 710(*i*) may be higher than the default read pass voltage.

In particular, in an exemplary embodiment, in the case where the degree of wear of the rewritable non-volatile memory module 43 is relatively high, through increasing the read pass voltage Vpass applied to the physical unit 710(*i*) during the period of executing the read operation on the physical unit 710(0), each memory cell in the physical unit 710(*i*) may be more easily conducted, which can help improve the correctness of data read from the physical unit 710(0).

Figure 11:
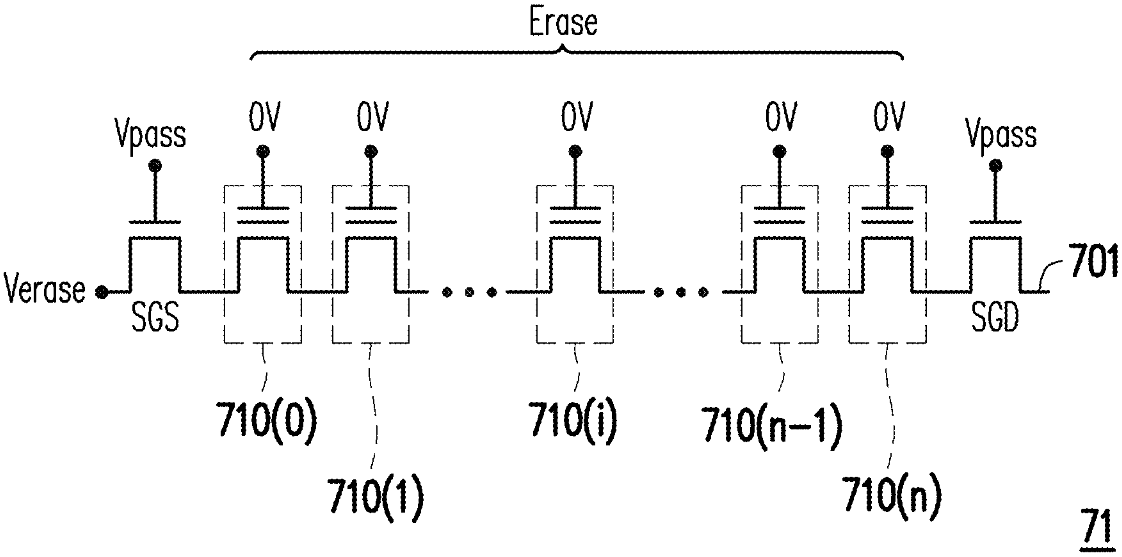
FIG. 11 is a schematic diagram of executing an erase operation on the first physical unit according to an exemplary embodiment of the disclosure.

FIG. 11 is a schematic diagram of executing an erase operation on the first physical unit according to an exemplary embodiment of the disclosure. Please refer to FIG. 11. In an exemplary embodiment, during a period of synchronously executing the erase operation on the physical units 710(0) to 710(*n*), an erase voltage Verase may be applied to the bit line 701 to synchronously erase data stored in the physical units 710(0) to 710(*n*).

Figure 12:
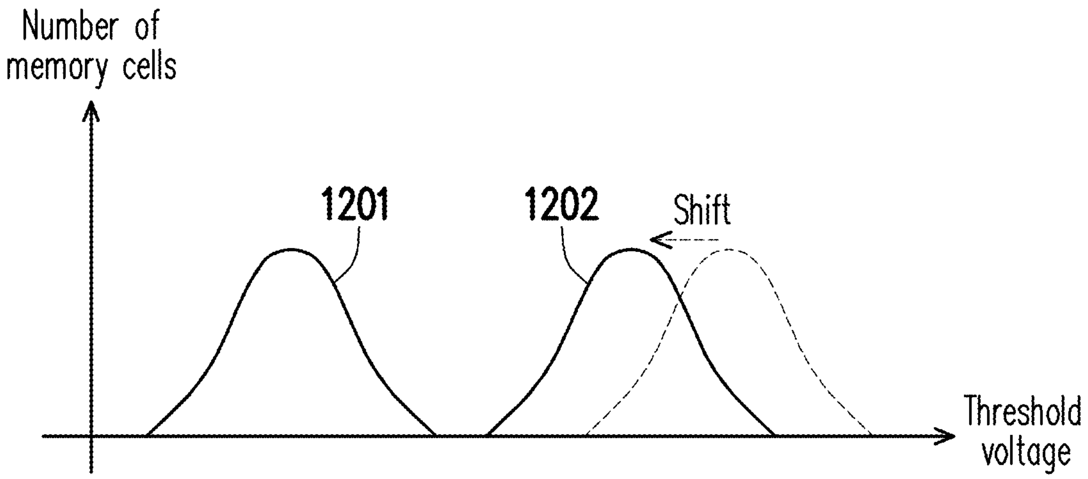
FIG. 12 is a schematic diagram of impact of dynamically adjusting at least one electrical parameter of the rewritable non-volatile memory module on a threshold voltage distribution of multiple memory cells in the first physical unit according to an exemplary embodiment of the disclosure.

FIG. 12 is a schematic diagram of impact of dynamically adjusting at least one electrical parameter of the rewritable non-volatile memory module on a threshold voltage distribution of multiple memory cells in the first physical unit according to an exemplary embodiment of the disclosure. Please refer to FIG. 12. It is assumed that the threshold voltage distribution of the memory cells in the first physical unit includes statuses 1201 and 1202.

In an exemplary embodiment, it is assumed that when dynamically adjusting at least one electrical parameter of the rewritable non-volatile memory module 43, the memory management circuit 51 reduces the programming voltage corresponding to the first physical unit and/or reduces the programming pass voltage corresponding to the first physical unit. After applying the adjusted electrical parameter, the status 1202 shifts toward the direction of lower voltage values (that is, the left). In this way, error bits caused by the threshold voltages of the memory cells being too high in data subsequently read from the first physical unit can be reduced.

Figure 13:
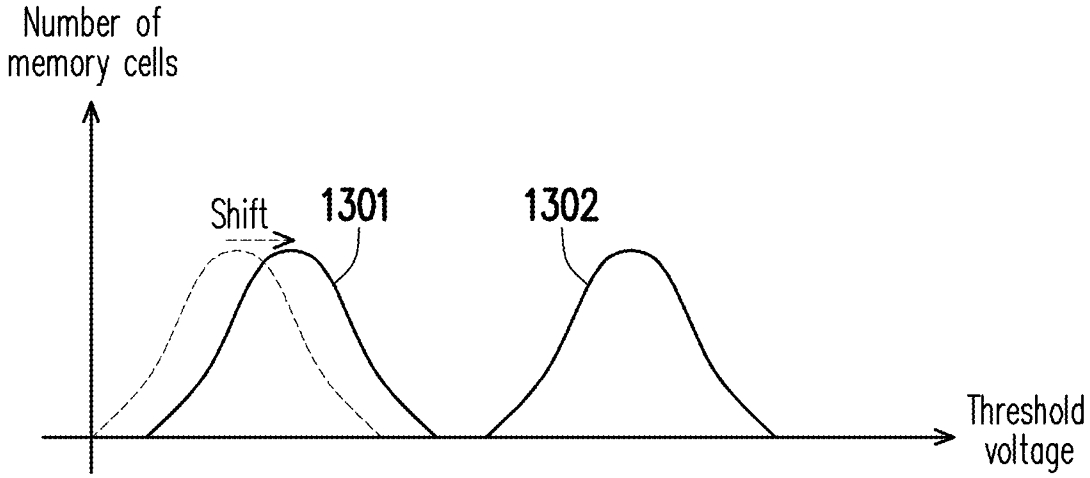
FIG. 13 is a schematic diagram of impact of dynamically adjusting at least one electrical parameter of the rewritable non-volatile memory module on the threshold voltage distribution of the memory cells in the first physical unit according to an exemplary embodiment of the disclosure.

FIG. 13 is a schematic diagram of impact of dynamically adjusting at least one electrical parameter of the rewritable non-volatile memory module on the threshold voltage distribution of the memory cells in the first physical unit according to an exemplary embodiment of the disclosure. Please refer to FIG. 13. It is assumed that the threshold voltage distribution of the memory cells in the first physical unit includes statuses 1301 and 1302.

In an exemplary embodiment, it is assumed that when dynamically adjusting at least one electrical parameter of the rewritable non-volatile memory module 43, the memory management circuit 51 reduces the erase voltage corresponding to the first physical unit and/or increases the erase verification voltage corresponding to the first physical unit. After applying the adjusted electrical parameter, the threshold voltage of the memory cell in an erase status (for example, the status 1301) in the first physical unit shifts toward the direction of higher voltage values (that is, the right). In this way, error bits caused by the threshold voltages of the memory cells being too high in data read from the first physical unit in subsequent operations can also be reduced.

In an exemplary embodiment, in response to the status of the rewritable non-volatile memory module 43 meeting the first condition, the memory management circuit 51 may also directly adjust at least one electrical parameter of the rewritable non-volatile memory module 43. For example, after judging that the status of the rewritable non-volatile memory module 43 meets the first condition, the memory management circuit 51 may skip (that is, not execute) the operation of sending the single-state read command and directly dynamically adjust at least one electrical parameter of the rewritable non-volatile memory module 43. For example, in an exemplary embodiment, when dynamically adjusting at least one electrical parameter of the rewritable non-volatile memory module 43, the memory management circuit 51 may increase the read pass voltage corresponding to the first physical unit and/or reduce the programming pass voltage corresponding to the first physical unit.

Figure 14:
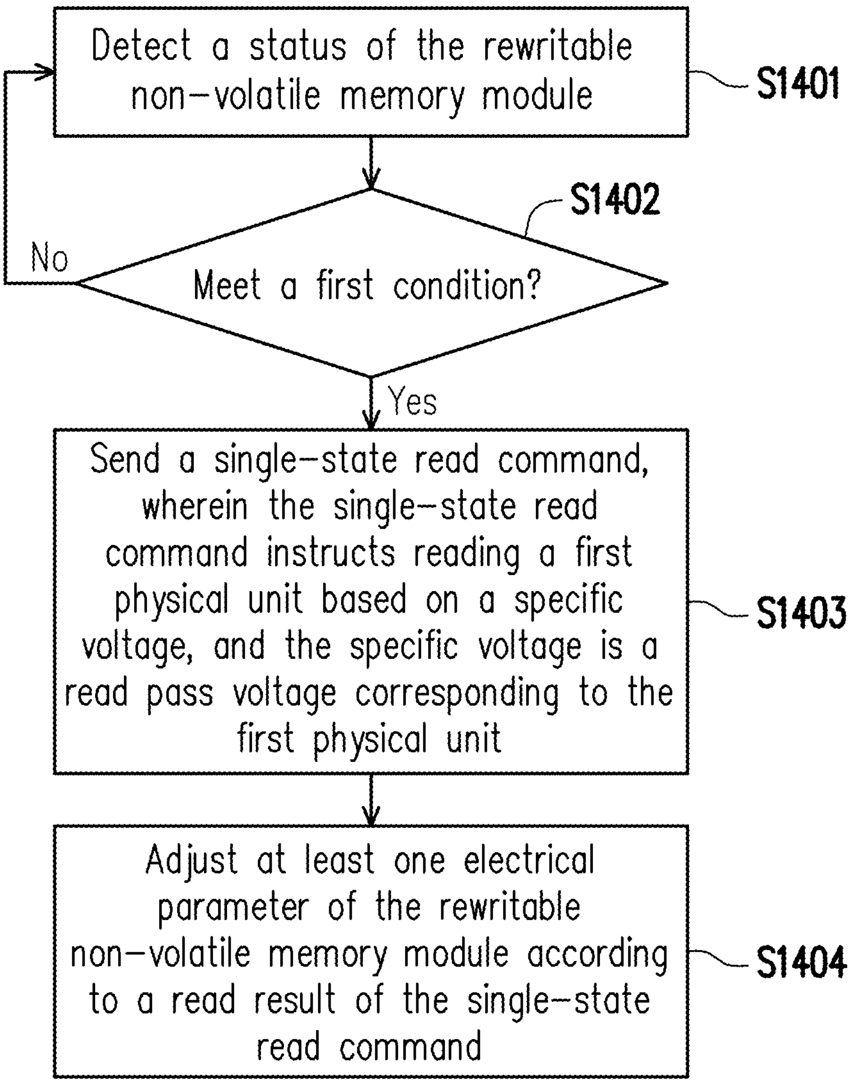
FIG. 14 is a flowchart of an electrical parameter adjustment method according to an exemplary embodiment of the disclosure.

FIG. 14 is a flowchart of an electrical parameter adjustment method according to an exemplary embodiment of the disclosure. Please refer to FIG. 14. In step S1401, a status of the rewritable non-volatile memory module is detected. In step S1402, whether the status of the rewritable non-volatile memory module meets a first condition is judged. If the status of the rewritable non-volatile memory module meets the first condition, in step S1403, a single-state read command is sent, wherein the single-state read command instructs reading a first physical unit based on a specific voltage, and the specific voltage is different from a read voltage corresponding to the first physical unit. For example, the specific voltage may be a read pass voltage corresponding to the first physical unit. However, if the status of the rewritable non-volatile memory module does not meet the first condition, step S1401 may be returned. In step S1404, at least one electrical parameter of the rewritable non-volatile memory module is adjusted according to a read result of the single-state read command.

Figure 15:
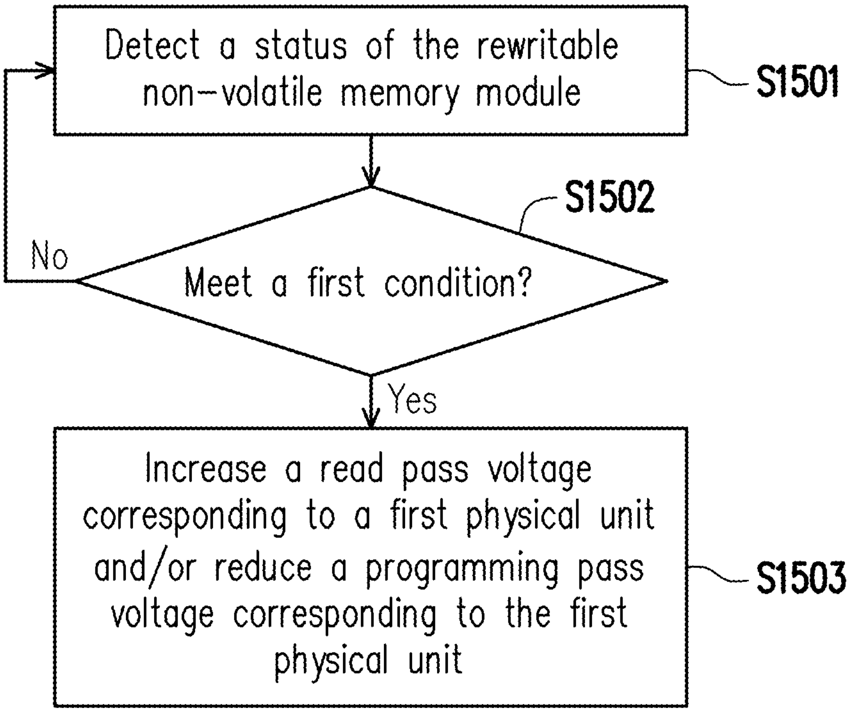
FIG. 15 is a flowchart of an electrical parameter adjustment method according to an exemplary embodiment of the disclosure.

FIG. 15 is a flowchart of an electrical parameter adjustment method according to an exemplary embodiment of the disclosure. Please refer to FIG. 15. In step S1501, a status of the rewritable non-volatile memory module is detected. In step S1502, whether the status of the rewritable non-volatile memory module meets a first condition is judged. If the status of the rewritable non-volatile memory module meets the first condition, in step S1503, at least one electrical parameter of the rewritable non-volatile memory module is adjusted. For example, in step S1503, a read pass voltage corresponding to a first physical unit may be increased and/or a programming pass voltage corresponding to the first physical unit may be reduced. However, if the status of the rewritable non-volatile memory module does not meet the first condition, step S1501 may be returned.

However, each step in FIG. 14 and FIG. 15 has been described in detail above and will not be described again here. It is worth noting that each step in FIG. 14 and FIG.

15 may be implemented as multiple program codes or circuits, which is not limited by the disclosure. In addition, the methods of FIG. 14 and FIG. 15 may be used in conjunction with the above exemplary embodiments or may be used alone, which is not limited by the disclosure.

In summary, the electrical parameter adjustment method, the memory storage device, and the memory control circuit unit according to the exemplary embodiments of the disclosure may particularly repair and/or prevent the right skew of the threshold voltage of the memory cell (which tends to generate more error bits) caused by the large amount of access behaviors (especially data write behaviors) executed on the rewritable non-volatile memory module during a computing process (or a similar operating environment) of an artificial intelligence model. In this way, the reliability of the rewritable non-volatile memory module can be effectively improved and/or the service life of the rewritable non-volatile memory module can be effectively extended.

Although the disclosure has been disclosed in the above embodiments, the embodiments are not intended to limit the disclosure. Persons skilled in the art may make some changes and modifications without departing from the spirit and scope of the disclosure. Therefore, the protection scope of the disclosure shall be defined by the appended claims.

What is claimed is:

1. An electrical parameter adjustment method for a rewritable non-volatile memory module, wherein the rewritable non-volatile memory module comprises a plurality of physical units, the electrical parameter adjustment method comprising:

detecting a status of the rewritable non-volatile memory module;

in response to the status of the rewritable non-volatile memory module meeting a first condition, sending a single-state read command, wherein the single-state read command instructs reading a first physical unit among the physical units by applying a specific voltage to the first physical unit, and the specific voltage is a read pass voltage corresponding to the first physical unit; and adjusting at least one electrical parameter of the rewritable non-volatile memory module according to a read result of the single-state read command.

2. The electrical parameter adjustment method according to claim 1, wherein the step of detecting the status of the rewritable non-volatile memory module comprises:

obtaining a wear evaluation value, wherein the wear evaluation value reflects a wear status of the rewritable non-volatile memory module; and in response to the wear evaluation value reaching a first threshold value, judging that the status of the rewritable non-volatile memory module meets the first condition.

3. The electrical parameter adjustment method according to claim 1, wherein the read pass voltage corresponding to the first physical unit is configured to be applied to the first physical unit during a period of executing a read operation on a second physical unit among the physical units to conduct a plurality of memory cells in the first physical unit.

4. The electrical parameter adjustment method according to claim 1, wherein the at least one electrical parameter comprises at least one of a programming voltage corresponding to the first physical unit, a programming pass voltage corresponding to the first physical unit, an erase voltage corresponding to the first physical unit, an erase verification voltage corresponding to the first physical unit, and the read pass voltage corresponding to the first physical unit.

5. The electrical parameter adjustment method according to claim 4, wherein the step of adjusting the at least one electrical parameter of the rewritable non-volatile memory module comprises:

at least one of reducing the programming voltage corresponding to the first physical unit, reducing the programming pass voltage corresponding to the first physical unit, reducing the erase voltage corresponding to the first physical unit, increasing the erase verification voltage corresponding to the first physical unit, and increasing the read pass voltage corresponding to the first physical unit.

6. The electrical parameter adjustment method according to claim 1, wherein the step of adjusting the at least one electrical parameter of the rewritable non-volatile memory module according to the read result of the single-state read command comprises:

in response to a total number of a plurality of target bits read through the single-state read command reaching a second threshold value, adjusting the at least one electrical parameter of the rewritable non-volatile memory module.

7. The electrical parameter adjustment method according to claim 6, wherein the total number of the target bits reflects a total number of at least one target memory cell in the first physical unit, and a threshold voltage of each of the at least one target memory cell is greater than the specific voltage.

8. A memory storage device, comprising:

a connection interface unit, configured to couple to a host system;

a rewritable non-volatile memory module; and a memory control circuit unit, coupled to the connection interface unit and the rewritable non-volatile memory module, wherein the rewritable non-volatile memory module comprises a plurality of physical units, and the memory control circuit unit is configured to:

detect a status of the rewritable non-volatile memory module;

in response to the status of the rewritable non-volatile memory module meeting a first condition, send a single-state read command, wherein the single-state read command instructs reading a first physical unit among the physical units by applying a specific voltage to the first physical unit, and the specific voltage is a read pass voltage corresponding to the first physical unit; and adjust at least one electrical parameter of the rewritable non-volatile memory module according to a read result of the single-state read command.

9. The memory storage device according to claim 8, wherein the operation of the memory control circuit unit detecting the status of the rewritable non-volatile memory module comprises:

obtaining a wear evaluation value, wherein the wear evaluation value reflects a wear status of the rewritable non-volatile memory module; and in response to the wear evaluation value reaching a first threshold value, judging that the status of the rewritable non-volatile memory module meets the first condition.

10. The memory storage device according to claim 8, wherein the read pass voltage corresponding to the first physical unit is configured to be applied to the first physical unit during a period of executing a read operation on a second physical unit among the physical units to conduct a plurality of memory cells in the first physical unit.

11. The memory storage device according to claim 8, wherein the at least one electrical parameter comprises at least one of a programming voltage corresponding to the first physical unit, a programming pass voltage corresponding to the first physical unit, an erase voltage corresponding to the first physical unit, an erase verification voltage corresponding to the first physical unit, and the read pass voltage corresponding to the first physical unit.

12. The memory storage device according to claim 11, wherein the operation of the memory control circuit unit adjusting the at least one electrical parameter of the rewritable non-volatile memory module comprises:

at least one of reducing the programming voltage corresponding to the first physical unit, reducing the programming pass voltage corresponding to the first physical unit, reducing the erase voltage corresponding to the first physical unit, increasing the erase verification voltage corresponding to the first physical unit, and increasing the read pass voltage corresponding to the first physical unit.

13. The memory storage device according to claim 8, wherein the operation of the memory control circuit unit adjusting the at least one electrical parameter of the rewritable non-volatile memory module according to the read result of the single-state read command comprises:

in response to a total number of a plurality of target bits read through the single-state read command reaching a second threshold value, adjusting the at least one electrical parameter of the rewritable non-volatile memory module.

14. The memory storage device according to claim 13, wherein the total number of the target bits reflects a total number of at least one target memory cell in the first physical unit, and a threshold voltage of each of the at least one target memory cell is greater than the specific voltage.

15. A memory control circuit unit, configured to control a rewritable non-volatile memory module, wherein the rewritable non-volatile memory module comprises a plurality of physical units, the memory control circuit unit comprising:

a host interface, configured to couple to a host system;

a memory interface, configured to couple to the rewritable non-volatile memory module; and a memory management circuit, coupled to the host interface and the memory interface, wherein the memory management circuit is configured to:

detect a status of the rewritable non-volatile memory module;

in response to the status of the rewritable non-volatile memory module meeting a first condition, send a single-state read command, wherein the single-state read command instructs reading a first physical unit among the physical units by applying a specific voltage to the first physical unit, and the specific voltage is a read pass voltage corresponding to the first physical unit; and adjust at least one electrical parameter of the rewritable non-volatile memory module according to a read result of the single-state read command.

16. The memory control circuit unit according to claim 15, wherein the operation of the memory management circuit detecting the status of the rewritable non-volatile memory module comprises:

obtaining a wear evaluation value, wherein the wear evaluation value reflects a wear status of the rewritable non-volatile memory module; and in response to the wear evaluation value reaching a first threshold value, judging that the status of the rewritable non-volatile memory module meets the first condition.

17. The memory control circuit unit according to claim 15, wherein the read pass voltage corresponding to the first physical unit is configured to be applied to the first physical unit during a period of executing a read operation on a second physical unit among the physical units to conduct a plurality of memory cells in the first physical unit.

18. The memory control circuit unit according to claim 15, wherein the at least one electrical parameter comprises at least one of a programming voltage corresponding to the first physical unit, a programming pass voltage corresponding to the first physical unit, an erase voltage corresponding to the first physical unit, an erase verification voltage corresponding to the first physical unit, and the read pass voltage corresponding to the first physical unit.

19. The memory control circuit unit according to claim 18, wherein the operation of the memory management circuit adjusting the at least one electrical parameter of the rewritable non-volatile memory module comprises:

at least one of reducing the programming voltage corresponding to the first physical unit, reducing the programming pass voltage corresponding to the first physical unit, reducing the erase voltage corresponding to the first physical unit, increasing the erase verification voltage corresponding to the first physical unit, and increasing the read pass voltage corresponding to the first physical unit.

20. The memory control circuit unit according to claim 15, wherein the operation of the memory management circuit adjusting the at least one electrical parameter of the rewritable non-volatile memory module according to the read result of the single-state read command comprises:

in response to a total number of a plurality of target bits read through the single-state read command reaching a second threshold value, adjusting the at least one electrical parameter of the rewritable non-volatile memory module.

21. The memory control circuit unit according to claim 20, wherein the total number of the target bits reflects a total number of at least one target memory cell in the first physical unit, and a threshold voltage of each of the at least one target memory cell is greater than the specific voltage.

22. An electrical parameter adjustment method for a rewritable non-volatile memory module, wherein the rewritable non-volatile memory module comprises a plurality of physical units, the electrical parameter adjustment method comprising:

detecting a status of the rewritable non-volatile memory module;

in response to the status of the rewritable non-volatile memory module meeting a first condition, adjusting at least one electrical parameter of the rewritable non-volatile memory module, wherein the step of adjusting the at least one electrical parameter of the rewritable non-volatile memory module comprises:

at least one of increasing a read pass voltage corresponding to a first physical unit among the physical units and reducing a programming pass voltage corresponding to the first physical unit, wherein the step of detecting the status of the rewritable non-volatile memory module comprises:

obtaining a wear evaluation value, wherein the wear evaluation value reflects a wear status of the rewritable non-volatile memory module; and in response to the wear evaluation value reaching a first threshold value, judging that the status of the rewritable non-volatile memory module meets the first condition.

23. A memory storage device, comprising:

a connection interface unit, configured to couple to a host system;

a rewritable non-volatile memory module; and a memory control circuit unit, coupled to the connection interface unit and the rewritable non-volatile memory module, wherein the rewritable non-volatile memory module comprises a plurality of physical units, and the memory control circuit unit is configured to:

detect a status of the rewritable non-volatile memory module;

in response to the status of the rewritable non-volatile memory module meeting a first condition, adjust at least one electrical parameter of the rewritable non-volatile memory module, wherein the operation of adjusting the at least one electrical parameter of the rewritable non-volatile memory module comprises:

at least one of increasing a read pass voltage corresponding to a first physical unit among the physical units and reducing a programming pass voltage corresponding to the first physical unit, wherein the operation of the memory control circuit unit detecting the status of the rewritable non-volatile memory module comprises:

obtaining a wear evaluation value, wherein the wear evaluation value reflects a wear status of the rewritable non-volatile memory module; and in response to the wear evaluation value reaching a first threshold value, judging that the status of the rewritable non-volatile memory module meets the first condition.

24. A memory control circuit unit, configured to control a rewritable non-volatile memory module, wherein the rewritable non-volatile memory module comprises a plurality of physical units, the memory control circuit unit comprising:

a host interface, configured to couple to a host system;

a memory interface, configured to couple to the rewritable non-volatile memory module; and a memory management circuit, coupled to the host interface and the memory interface, wherein the memory management circuit is configured to:

detect a status of the rewritable non-volatile memory module;

in response to the status of the rewritable non-volatile memory module meeting a first condition, adjust at least one electrical parameter of the rewritable non-volatile memory module, wherein the operation of adjusting the at least one electrical parameter of the rewritable non-volatile memory module comprises:

at least one of increasing a read pass voltage corresponding to a first physical unit among the physical units and reducing a programming pass voltage corresponding to the first physical unit, wherein the operation of the memory management circuit detecting the status of the rewritable non-volatile memory module comprises:

obtaining a wear evaluation value, wherein the wear evaluation value reflects a wear status of the rewritable non-volatile memory module; and in response to the wear evaluation value reaching a first threshold value, judging that the status of the rewritable non-volatile memory module meets the first condition.

* * * * *